United States Patent [19]
Hwu et al.

[11] Patent Number: 6,002,703
[45] Date of Patent: Dec. 14, 1999

[54] GAUSSIAN PROFILE PROMOTING CAVITY FOR SEMICONDUCTOR LASER

[75] Inventors: Ruey-Jen Hwu; Wei Xu, both of Salt Lake City, Utah

[73] Assignee: University of Utah Research Foundation, Salt Lake City, Utah

[21] Appl. No.: 09/015,488

[22] Filed: Jan. 28, 1998

[51] Int. Cl.$^6$ .................................................. H01S 3/08
[52] U.S. Cl. .............................. 372/92; 372/99; 372/108
[58] Field of Search .................................. 372/92, 99, 108

[56] References Cited

U.S. PATENT DOCUMENTS

| | | |
|---|---|---|
| 4,477,730 | 10/1984 | Fukuda et al. . |
| 4,485,474 | 11/1984 | Osterwalder ............................... 372/28 |
| 4,995,050 | 2/1991 | Waarts et al. ............................... 372/95 |
| 5,001,722 | 3/1991 | Klement et al. ........................... 372/99 |
| 5,007,059 | 4/1991 | Keller et al. ............................... 372/18 |
| 5,050,179 | 9/1991 | Mooradian ................................. 372/44 |
| 5,131,002 | 7/1992 | Mooradian ................................. 372/50 |
| 5,166,755 | 11/1992 | Gat .......................................... 356/419 |
| 5,417,799 | 5/1995 | Daley et al. . |
| 5,442,651 | 8/1995 | Maeda ....................................... 372/97 |
| 5,486,951 | 1/1996 | Hamblen . |
| 5,494,783 | 2/1996 | Harris . |
| 5,496,616 | 3/1996 | Harris . |
| 5,530,714 | 6/1996 | Vilhelmsson et al. ..................... 372/92 |
| 5,572,542 | 11/1996 | Dixon ........................................ 372/92 |
| 5,594,591 | 1/1997 | Yamamoto et al. .......................... 349/5 |
| 5,606,572 | 2/1997 | Swirhun et al. ........................... 372/96 |
| 5,636,059 | 6/1997 | Snyder ..................................... 359/668 |

OTHER PUBLICATIONS

Gray et al., *Control of Optical–Feedback–Induced Laser Intensity Noise in Optical Data Recording,* Optical Engineering, vol. 32, No. 4, pp. 739–744, Apr. 1993.

Pan et al., *Semiconductor Laser Dynamics Subject to Strong Optical Feedback,* Optics Letters, vol. 22, No. 3, pp. 166–168, Feb. 1997.

Sui et al., *Experimental Study and Computer Simulation of Filamentation in Broad–area Semiconductor Lasers,* SPIE's International Symposia, Feb. 1997.

Gray et al., *Spatio–Temporal Dynamics of Broad–Area Semiconductor Lasers with Optical Feedback,* Abstracts, p. 39, Fourth SIAM Conference on Application of Dynamical Systems, May 1997.

J. Marciante et al., *Nonlinear Mechanisms of Filamentation in Broad–Area Semiconductor Lasers,* IEEE Journal of Quantum Electronics, vol. 32, No. 4, Apr. 1996.

S. Sze, *LED and Semiconductor Lasers,* Physics of Semiconductor Devices, Second Edition, Part V, Photonic Devices, Chapter 12, pp. 704–721, 1981. (No Month).

Gray et al., *Spiricon Application Note: Filamentation in Broad–Area Semiconductor Lasers,* Electrical Engineering Department, University of Utah.

*Primary Examiner*—James W. Davie
*Attorney, Agent, or Firm*—Workman, Nydegger & Seeley

[57] ABSTRACT

A system and method for generating a laser beam from a semiconductor laser in order to eliminate or substantially reduce filamentation of the laser beam. The system and method utilizes an external optical member such as a reflector to improve or enhance the overall laser beam quality produced. The reflector has a Gaussian intensity profile promoting cavity such as a parabolic cavity, with the cavity having a focal length a preselected distance from the cavity surface. The semiconductor laser is positioned such that the facet of the semiconductor laser is at the focal length distance from the cavity surface. The cavity has a mode-selecting reflective surface such that the beam has a substantially Gaussian intensity profile. A beam splitter can be optionally employed between the semiconductor laser and the optical reflector for certain applications if desired. Alternatively, an external digital optics member can be employed with a semiconductor laser to produce a beam with a substantially Gaussian intensity profile.

41 Claims, 6 Drawing Sheets

GAUSSIAN PROFILE PROMOTING CAVITY FOR SEMICONDUCTOR LASER

BACKGROUND OF THE INVENTION

1. The Field of the Invention

The present invention is related generally to techniques for improving the beam quality of semiconductor lasers. More specifically, the present invention is related to a system and method which utilize an external optical member with a Gaussian intensity profile promoting cavity or surface for improving or enhancing the overall beam quality of broad-area semiconductor lasers.

2. The Relevant Technology

Lasers are widely used in various technologies such as telecommunications, medical treatments, remote sensing, printing, etc. The need for higher power lasers has increased over the years in some technology areas. Conventionally, in order to provide a laser with increased power, it was necessary to increase the size of the laser, resulting in a substantial cost increase. Thus, an expensive laser that filled an entire room could provide a desired power level, but was infeasible for many applications.

Semiconductor lasers were developed to meet the need of smaller size for lasers in certain applications. The compact size of semiconductor lasers is advantageous in applications such as optical fiber communications. Most high power semiconductor lasers are made in the so-called "stripe geometry" and are of the "broad-area" type, where the term "area" refers to the active area of the junction from where the laser radiation is emitted. The width of the active area is typically in the range of about 50 $\mu$m to about 500 $\mu$m and the thickness is typically on the order of 1 $\mu$m or less.

It is desirable to make the active layer thickness as thin as possible to achieve lower threshold current density. By making the active layer thinner, however, the aperture from which the laser radiation is emitted is also smaller, which makes the beam subject to a large divergence due to aperture diffraction effects. In order to achieve maximum power in the beam, a larger active layer is desirable, as the peak power of a semiconductor laser is directly proportional to the active area of the emitting facet of the device.

The achievement of high power, however, results in decreased laser beam quality. For a broad-area gain region, lateral confinement becomes so weak that the lateral mode profile of the beam can break into multiple filaments. In particular, the beam is broadly divergent, which results in a power distribution that is not focused into one spot or point. Instead the power distribution is spread over a larger area and into separate filaments. This problem, commonly referred to as filamentation, has made it extremely difficult to develop broad-area semiconductor lasers that are efficient and capable of a high level of output power.

Various approaches have been developed to alleviate the beam filamentation problem in broad-area semiconductor lasers. A conventional technique implements an external reflective cavity to control and optimize laser mode profiles through proper cavity design. For example, external cavity configurations have been used employing a planar, cylindrical, or spherical mirror together with a spherical or cylindrical lens or a system of such lenses, to compensate for the filamentation problem inherent in broad-area lasers. Such techniques are disclosed in U.S. Pat. No. 5,050,179 to Mooradian.

The use of such conventional lens and mirror systems with semiconductor lasers presents difficulties and is costly to implement effectively. The divergent beams can be difficult to align using the lens and mirror system. Further, the accurate placement and size of each lens complicates the design and typically results in a reduction in the efficiency of the system.

Accordingly, there is a need for improved semiconductor laser systems that overcome or avoid the above problems and difficulties.

SUMMARY AND OBJECTS OF THE INVENTION

It is a primary object of the present invention to provide a system and method for improving the beam quality of broad-area semiconductor lasers.

A further object of the invention is to provide a system and method for generating a laser beam from a semiconductor laser that eliminate or substantially reduce filamentation of the laser beam.

Another object of the invention is to provide system and method which decrease the expense and difficulty associated with conventional lens systems used in semiconductor lasers.

Still another object of the invention is to provide precise, compact, and inexpensive laser systems and methods which achieve spatial and modal control for broad-area semiconductor lasers.

To achieve the forgoing objects, and in accordance with one aspect of the invention as embodied and broadly described herein, a laser system for generating a laser beam from a semiconductor laser is provided which improves or enhances the overall beam quality. The laser system includes an external optical member having a Gaussian intensity profile promoting cavity or surface which is operatively positioned with respect to the facet of the semiconductor laser.

In one embodiment, the external optical member is an external optical reflector having a Gaussian intensity profile promoting cavity, such as a parabolic cavity, with the cavity having a focal length a preselected distance from the cavity surface. The semiconductor laser having an active gain region and a beam emitting facet is positioned such that the facet is at the focal length distance from the cavity surface. The cavity has a mode-selecting reflective surface which forces the beam into a Gaussian, near-Gaussian, or super-Gaussian intensity profile. A beam splitter can be optionally employed between the semiconductor laser and the optical reflector for certain applications if desired.

In another embodiment of the invention, the external optical member can be an external digital optics member which is positioned adjacent to the semiconductor laser. The external digital optics member has a Gaussian intensity profile promoting surface contiguous with the facet of the semiconductor laser. The Gaussian intensity profile promoting surface is formed by etching a plurality of steps into the surface material such that laser light passing therethrough has an intensity profile with a substantially Gaussian shape.

In another aspect of the invention, a method of generating a laser beam from a semiconductor laser is provided in order to eliminate or substantially reduce filamentation of the laser beam. This method includes providing a semiconductor laser having an active gain region with a beam emitting facet, and positioning an external optical reflector having a Gaussian profile-promoting cavity such that the facet of the semiconductor laser is at the focal length distance from the cavity surface. A laser beam from the semiconductor laser is directed at the cavity of the optical reflector resulting in a beam having a substantially Gaussian intensity profile without filamentation.

A method of generating a laser beam from a semiconductor laser in order to eliminate or substantially reduce filamentation of the laser beam by utilizing the external digital optics member described above is also provided.

These and other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
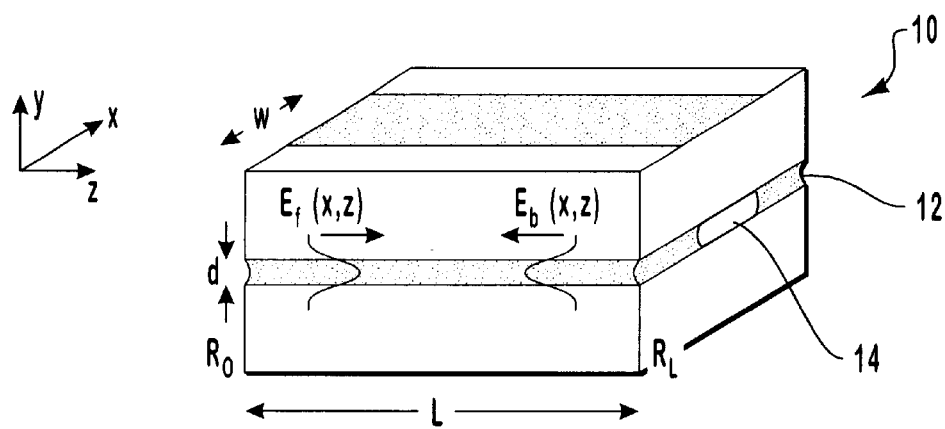
FIG. 1 is a schematic illustration of a perspective view of a semiconductor laser device that can be used in the present invention.

The present invention is directed to laser systems and methods which utilize an external optical member to improve or enhance the overall laser beam quality produced by broad-area semiconductor lasers. A laser system according to the invention generally includes a semiconductor laser having a light emitting facet and an active gain region. An external optical member having a Gaussian intensity profile promoting cavity or surface is operatively positioned with respect to the facet of the semiconductor laser. A beam splitter can be optionally employed if desired for certain applications. The present invention eliminates or substantially reduces the filamentation problems associated with conventional broad-area semiconductor lasers.

The external optical member can be an external optical reflector with a cavity of any shape that promotes a laser light intensity profile having a substantially Gaussian shape without the use of a lens or series of lenses. In one preferred embodiment, the cavity is formed in a parabolic shape and the semiconductor laser is positioned such that the facet is at the focal point of the parabolic cavity. The parabolic shape of the cavity has been found to promote a Gaussian intensity profile of a beam produced by a broad-area semiconductor laser. Alternatively, the external optical member can be an external digital optics member having a Gaussian intensity profile promoting surface which is placed against the facet side of the semiconductor laser so that laser light is produced with an intensity profile having a substantially Gaussian shape.

In generating laser light it is preferable to obtain a beam shape that has a normal curve, also known as a "Gaussian" profile, with respect to intensity of the light. A Gaussian beam has desirable qualities which include an amplitude which falls off smoothly and rapidly with the distance from the axis of light propagation. Such a beam also carries finite, non-zero power across the beam cross section, in contrast to filamented beam profiles which have near zero intensity at certain points. Further, a Gaussian beam retains its profile at more distant planes with respect to the axis of propagation, even after reflections or passage through apertures.

A Gaussian profile may be expressed mathematically in the following equation (1):

$$I(r) = (2P/\pi w^2)\exp(-2r^2/w^2) \qquad (1)$$

where I is the intensity, P is the power of the beam, w is the width of the beam spot, and r is the radial distance from the center of the beam spot out to the edge of the beam spot. A beam with this type of intensity profile may be classified as propagating in a Gaussian mode.

The parabolic cavity or digital optics member used in the present invention are designed such that broad-area semiconductor lasers achieve coherent, high power output in a Gaussian, near-Gaussian, or super-Gaussian mode. The term "near-Gaussian" means that the shape of the intensity profile is similar to a normal curve. The curves of the graphs of FIGS. 6 and 7, discussed in further detail below, are examples of a "near-Gaussian" mode. The term "super-Gaussian" means that the shape of the intensity profile is similar to a normal curve except for a flattened vertex portion on the super-Gaussian curve. The term "substantially Gaussian" used herein in conjunction with intensity phase profiles is intended to encompass Gaussian, near-Gaussian, super-Gaussian, or other like shapes.

Referring to the drawings, wherein like structures are provided with like reference designations, FIG. 1 is a schematic depiction of a conventional semiconductor laser 10, such as a broad-area diode laser, shown with an x-y-z coordinate diagram to aid in the discussion below. The semiconductor laser 10 has a length L and a stripe width w. An active layer 12 forming an active gain region of semiconductor laser 10 has a thickness d and an aperture or facet 14 formed therein for emitting laser light. An anti-reflection coating can be formed on the end of laser 10 where facet 14 is located, and a high reflection coating can be formed on the other end. The facet reflectivities located at z=0 and z=L are $R_0$ and $R_L$, respectively. The forward traveling wave in the x-z plane in semiconductor laser 10 is represented by $E_f$, while the backward traveling wave is represented by $E_b$.

The semiconductor laser 10 will emit light from aperture 14 in a widely divergent beam, with an angle of divergence in the x-z plane greater than about 70° and an angle of divergence in the y-z plane up to about 18°. The semiconductor laser 10 can be formed of a gallium aluminum arsenic compound or other suitable material known to those skilled in the art.

Figure 2:
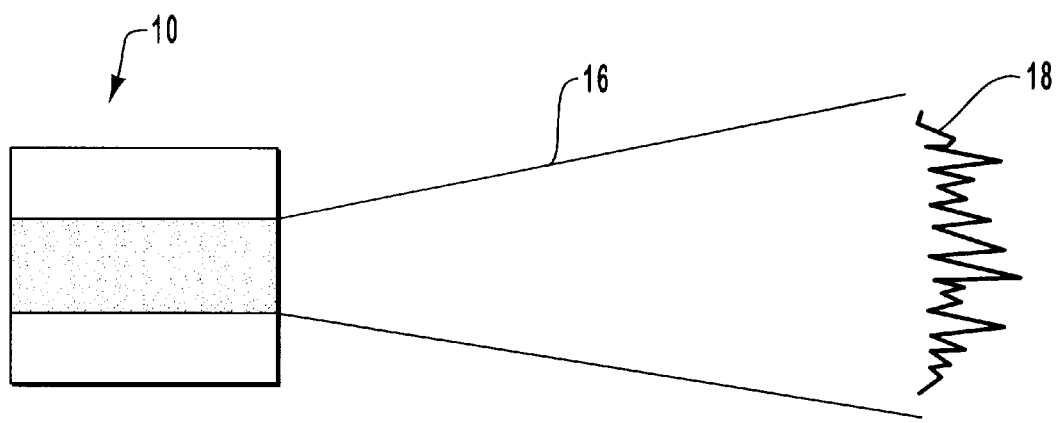
FIG. 2 is a schematic illustration of a top view of the laser device of FIG. 1 during operation.

FIG. 2 is a schematic illustration of semiconductor laser 10 during operation without any external reflectors or other optics. As shown, a beam 16 is emitted from semiconductor laser 10 and diverges into a number of undesirable filaments represented by an intensity profile 18 having a jagged shape.

Figure 3:
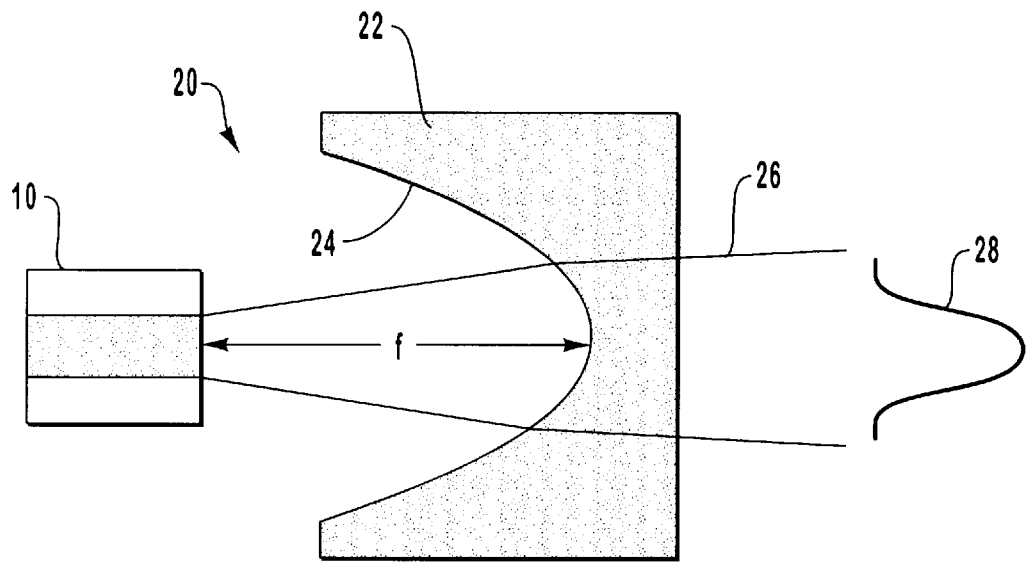
FIG. 3 is a schematic illustration of a top view of one embodiment of a laser system with an external optical cavity according to the present invention.

FIG. 3 is a top view schematic illustration of a laser system 20 according to one embodiment of the present invention. The laser system 20 includes semiconductor laser 10 and an external optical reflector 22, which are operatively arranged in an effective optical configuration. The optical reflector 22 preferably has a substantially parabolic cavity 24. The optical reflector 22 is oriented such that parabolic cavity 24 faces facet 14 of semiconductor laser 10. The semiconductor laser 10 is positioned so that facet 14 is located a focal length f from the parabolic curve of parabolic cavity 24 as shown in FIG. 3. The focal length is preferably less than about 20 mm and is measured from facet 14 to the vertex of parabolic cavity 24. Preferably, optical reflector 22 is a cylindrical parabolic reflector that is formed by translating a parabola perpendicular to the plane in which it lies.

The optical reflector 22 is formed of conventional materials that render optical reflector 22 semi-reflective so as to reflect a portion of the emitted light back to aperture 14 and transmit the remaining portion of light therethrough. The optical reflector 22 can have a transmittivity up to about 30% (or a reflectivity of at least about 70%), and preferably a transmittivity of up to about 50% (or a reflectivity of at least about 50%). The optical reflector 22 can be formed of light transmissive materials such as various plastics or glass. A variety of conventional antireflective coatings or layers can be applied to the surface of optical reflector 22 to produce the desired reflectivity or transmittivity properties for a particular application.

During operation of laser system 20, semiconductor laser 10 emits a diverging beam 26 that is incident upon optical reflector 22. Since facet 14 is located at the focal point of parabolic cavity 24, the portion of beam 26 which is transmitted through optical reflector 22 has substantially reduced or no filamentation and is represented by an intensity profile 28 with a substantially Gaussian shape. The remaining portion of beam 26 is reflected back towards facet 14 of semiconductor laser 10 to produce an optical feedback effect. Thus power enhancement and optimum beam profiling are achieved by the system of the present invention.

Figure 4:
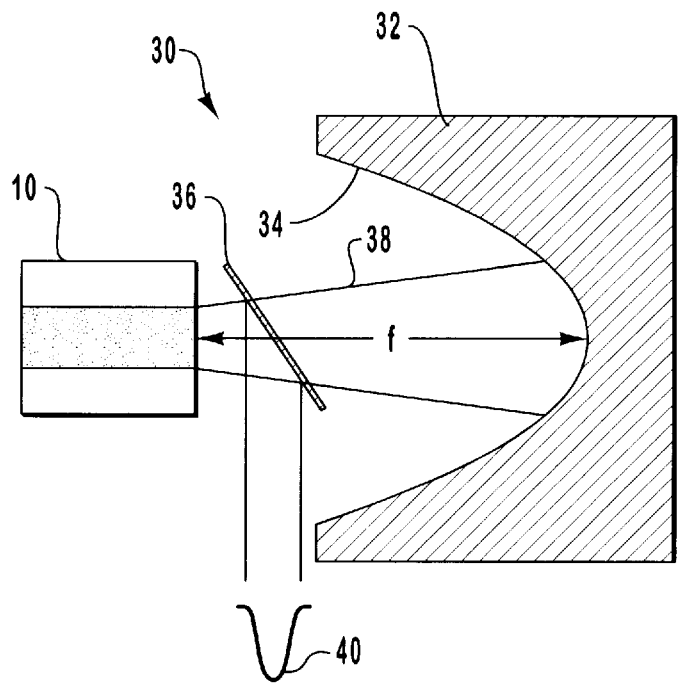
FIG. 4 is a schematic illustration of a top view of another embodiment of a laser system with an external optical cavity according to the present invention.

FIG. 4 is a top view schematic illustration of a laser system 30 according to another embodiment of the present invention. The laser system 30 includes semiconductor laser 10, an external optical reflector 32, and a beam splitter 36, which are operatively arranged in an effective optical configuration. The optical reflector 32 preferably has a substantially parabolic cavity 34. The optical reflector 32 is oriented such that parabolic cavity 34 faces aperture 14 of semiconductor laser 10. The semiconductor laser 10 is positioned so that aperture 14 is located at the focal point f of parabolic cavity 34.

Preferably, optical reflector 32 is a cylindrical parabolic reflector, with parabolic cavity 34 having a mirrored surface that reflects substantially all of the light emitted by semiconductor laser 10. The optical reflector 22 can be formed of various materials such as metals, plastics, glass, or combinations thereof in order to produce a mirrored surface that is highly reflective. For example, a layer of a suitable reflective metal can be formed on the parabolic surface of optical reflector 22 to produce a mirrored surface. Suitable reflective metals include nickel, aluminum, or other reflective metals.

The beam splitter 36 is positioned between semiconductor laser 10 and optical reflector 32 at a predetermined location so that a beam 38 is incident on beam splitter 36. The beam splitter 36 is preferably oriented at a suitable angle in order to deflect a portion of the reflected light from optical reflector 32 away from laser system 30. For example, the beam splitter 36 can be at an angle of about 45° with respect to the direction of light propagation (i. e., the z direction). The beam splitter 36 can be formed of light transmissive materials such as various plastics or glass. A variety of conventional optical coatings or layers can be applied to the surfaces of beam splitter 36 to produce the desired reflectivity, transmittivity, or deflection properties for a particular application.

During operation of laser system 30, semiconductor laser 10 emits a diverging beam 38 that is incident upon beam splitter 36 and optical reflector 32. The beam 38 is reflected back towards beam splitter 36 and facet 14 of semiconductor laser 10. A portion of beam 38 is transmitted back through beam splitter 36 toward facet 14 to produce an optical feedback effect. The remaining portion of beam 38 is deflected by beam splitter 36 at an angle of about 90° with respect to the direction of light propagation (i.e., the z direction). The portion of beam 38 which is deflected by beam splitter 36 has substantially reduced or no filamentation, represented by an intensity profile 40 with a substantially Gaussian shape.

Figure 10:
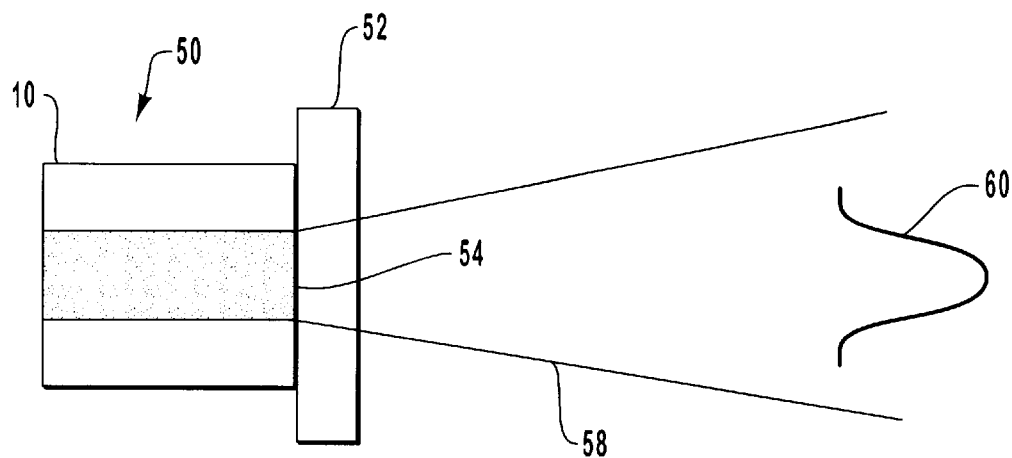
FIG. 10 is a schematic illustration of a top view of another embodiment of a laser system with an external digital optics member according to the present invention.
Figure 11:
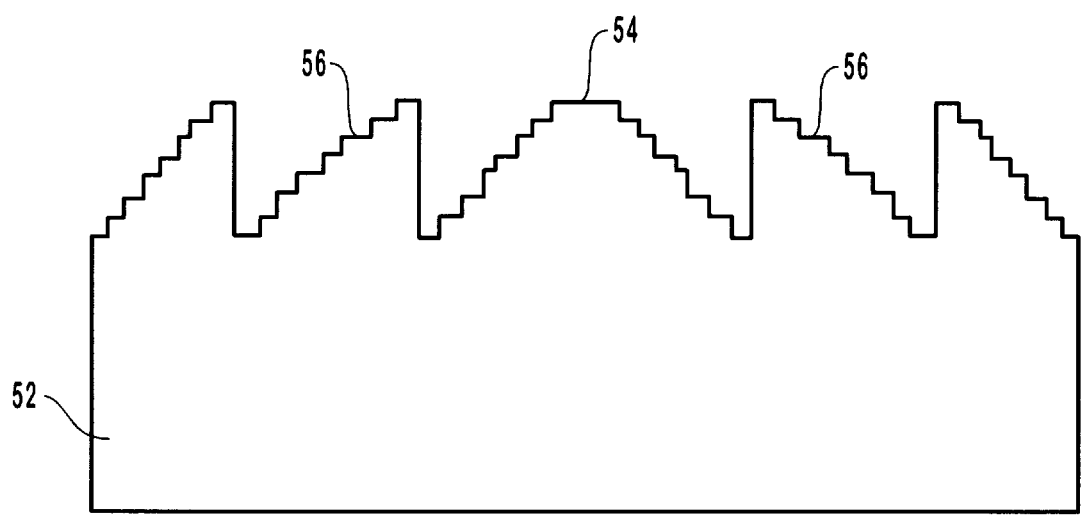
FIG. 11 is an enlarged partial elevation view of the external digital optics member of the laser system shown in FIG. 10.

FIG. 10 is a top view schematic illustration of a laser system 50 according to another embodiment of the invention. The laser system 50 includes semiconductor laser 10 and an external digital optics member 52 positioned adjacent to semiconductor laser 10. The digital optics member 52 has a planar Gaussian intensity profile promoting surface 54 which is contiguous with the facet of semiconductor laser 10. FIG. 11 is an enlarged partial view of digital optics member 52 showing surface 54 which has been etched to produce a plurality of steps 56 such that a beam passing therethrough has an intensity profile with a substantially Gaussian shape. The desired intensity phase profile produced by a parabolic reflector or mirror is realized on a planar surface by etching steps into the surface material to approximate the slope required for constituting the desired intensity phase profile. Thus, a laser beam produced by laser system 50 has an intensity profile with a substantially Gaussian shape similar to that produced by using a parabolic reflector.

The digital optics member is formed of conventional materials that render it semi-reflective so as to reflect a portion of the emitted light back to the facet of the semiconductor laser and transmit the remaining portion of light therethrough. The digital optics member preferably has a transmittivity of up to about 50% (or a reflectivity of at least about 50%). The digital optics member is formed of light transmissive materials such as various plastics or glass. A variety of conventional antireflective coatings or layers can be applied to the surfaces of the digital optics member to produce the desired reflectivity or transmittivity properties for a particular application.

During operation of laser system 50, semiconductor laser 10 emits a diverging beam 58 that is incident upon digital optics member 52. The portion of beam 58 which is transmitted through digital optics member 52 has substantially reduced or no filamentation and is represented by an intensity profile 60 with a substantially Gaussian shape. The remaining portion of beam 58 is reflected back towards the facet of semiconductor laser 10 to produce an optical feedback effect.

The present invention may also be used in an array of semiconductor lasers. For example, a stack or bar of laser diodes can be arranged along the y-axis, with the diverging beams emitted therefrom being incident upon an elongated parabolic reflector or digital optics member operatively positioned with respect to the laser diodes. The beams produced by the array of semiconductor lasers would be the same as discussed above for the single laser embodiments, having intensity profiles with a substantially Gaussian shape.

The present invention provides many benefits and advantages. The beam quality of broad-area semiconductor lasers is improved since filamentation of the beam is eliminated or substantially reduced. Also, the expense and difficulty associated with conventional lens systems used in semiconductor lasers is avoided, since the present invention produces a high quality laser beam with a Gaussian or near Gaussian profile without such lens systems. The present invention provides precise, compact, and inexpensive laser systems and methods which achieve spatial and modal control for broad-area semiconductor lasers. In addition, the present invention maximizes the usable power density for broad-area semiconductor lasers.

The following examples are given to illustrate the systems and methods of the present invention, and are not intended to limit the scope of the present invention. The numerical simulation discussed below in Example 1 was based on a scheme suggested in Marciante et al., *IEEE J. Quantum Electron.*, vol.32, pp. 590–596 (1996), the disclosure of which is herein incorporated by reference. The numerical simulation is a beam propagating model for a broad-area semiconductor laser with an external optical cavity according to the invention which employs a mode-selecting mirror.

EXAMPLE 1

For a semiconductor laser of length L and stripe width w, such as shown in FIG. 1, operating continuously at some pumping current density J(x,z), the propagation of the beam inside the laser material was modelled by the following wave equations (2a and 2b):

$$\frac{\partial E_f}{\partial z} = \frac{i}{2k}\frac{\partial^2 E_f}{\partial x^2} + \left[\frac{1}{2}\Gamma(1 - i\alpha)g(N) - \frac{\alpha_{int}}{2} + in_2k_0(|E_f|^2 + 2|E_b|^2)\right]E_f \quad (2a)$$

$$-\frac{\partial E_b}{\partial z} = \frac{i}{2k}\frac{\partial^2 E_b}{\partial x^2} + \left[\frac{1}{2}\Gamma(1 - i\alpha)g(N) - \frac{\alpha_{int}}{2} + in_2k_0(|E_b|^2 + 2|E_f|^2)\right]E_b \quad (2b)$$

where $E_f$ is the forward traveling wave, $E_b$ is the backward traveling wave, $\Gamma$ is the transverse confinement factor, $\alpha$ is the linewidth-enhancement factor, $\alpha_{int}$ is the internal loss, $n_2$ is the Kerr coefficient, and $g(N) = a(N - N_0)$ is the local carrier-dependent gain, which is linearly related to the carrier density N(x,z).

For a broad area laser with a very thin active gain layer, the carrier density distribution N(x,z) can be solved from the following equation (3):

$$D\frac{\partial^2 N(x, z)}{\partial x^2} = -\frac{J(x, z)}{qd} + \frac{N(x, z)}{\tau_{in}} + BN^2(x, z) + \frac{\Gamma g(N)}{\hbar w}(|E_f|^2 + |E_b|^2) \quad (3)$$

The above equations can give the whole picture of the beam propagation inside the laser gain region. With the use of an external cavity, the boundary conditions are defined by the following equations (4a and 4b):

$$E_f(x, 0) = \sqrt{R_0}E_b(x, 0) + \int E_b(x, 0)\exp(i\phi_b(x, x'))dx' \quad (4a)$$

$$E_b(x, 0) = \sqrt{R_0}E_f(x, 0) + \int E_f(x, 0)\exp(i\phi_f(x, x'))dx' \quad (4b)$$

where the second term stands for the reflecting beam from the external cavity and $\phi(x,x')$ is the phase change between the point x and the reflected point x'. Generally, $\phi(x,x')$ carries a very complex expression. For a Gaussian profile cavity, $\phi(x,x')$ has a quadratic form and is equal to $-\alpha(x-x')^2$, where $\alpha$ is proportional to the focal length of the Gaussian cavity such as a parabolic mirror.

The wave equations (2a and 2b) were solved iteratively by the split-step Fourier method. For every iteration, the forward and backward traveling beams were calculated using the fast Fourier transform (FFT) algorithm described in Agrawal, *J. Appl. Phys.*, vol. 56, pp. 3100–3109 (1984), the disclosure of which is herein incorporated by reference. At the facets, the two beams were related by the boundary conditions. The integration across the boundary area was carried out each time. The carrier density distributions were solved through a tridiagonal matrix method using the finite-difference approximation of the second order derivative term.

The stopping criterion was taken as that the sum of the squares of the changes in the E field over the two facets from one iteration to the next was smaller than a prescribed tolerance (tol). When the code stopped based on this criterion, then the solution was converging and stable. When the result failed to converge after a lot of iterations, the output of the laser was viewed as unstable, and corresponding to, physically, a snapshot at some time after the relaxation oscillation transients had died out.

The parameter values used in the above numerical simulations are listed below in Table 1.

TABLE 1

Parameter Values Used in Numerical Simulations

| Physical Quantity | Symbol | Value |
|---|---|---|
| Laser Wavelength | $\lambda$ | 980 nm |
| Gain Region Length | L | 250 $\mu$m |
| Contact Stripe Width | w | 100 $\mu$m |
| Active Layer Thickness | d | 1 $\mu$m |
| Transverse Confinement Factor | $\Gamma$ | 0.2 |
| Facet Reflectivities | $R_o, R_L$ | 0.05 |
| Effective Index | $n_{eff}$ | 3.5 |
| Kerr Coefficient | $n_2$ | 0.0 |
| Linewidth-enhancement Factor | $\alpha$ | 3.0 |
| Internal Loss | $\alpha_{int}$ | 1000 m$^{-1}$ |
| Gain Cross Section | a | 1.5 × 10$^{-20}$ m$^2$ |
| Diffusion Constant | D | 0.0033 m$^2$/s |
| Transparency Carrier Density | $N_o$ | 1.0 × 10$^{24}$ m$^3$ |
| Non-radiative Lifetime | $\tau_{nr}$ | 5 ns |
| Spontaneous-emission Coefficient | B | 1.4 × 10$^{-16}$ m$^3$/s |

It should be noted that the simulation was initialized by using a cosine lateral profile at z=0.

Figure 5:
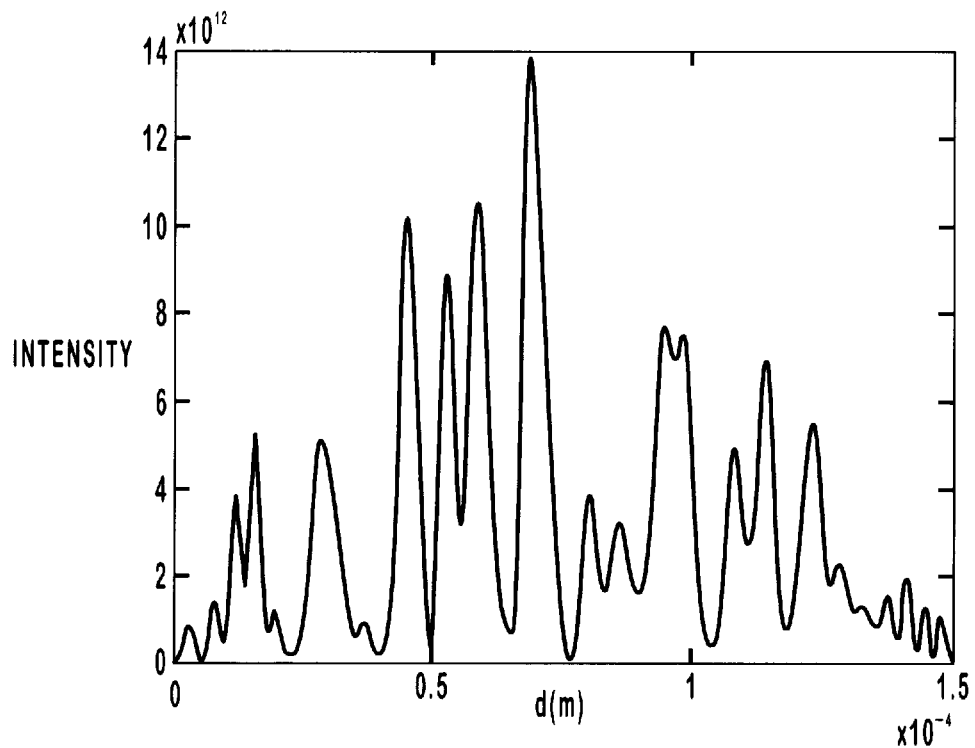
FIG. 5 is a graph illustrating the intensity profile of a conventional broad-area is semiconductor laser beam.
Figure 6:
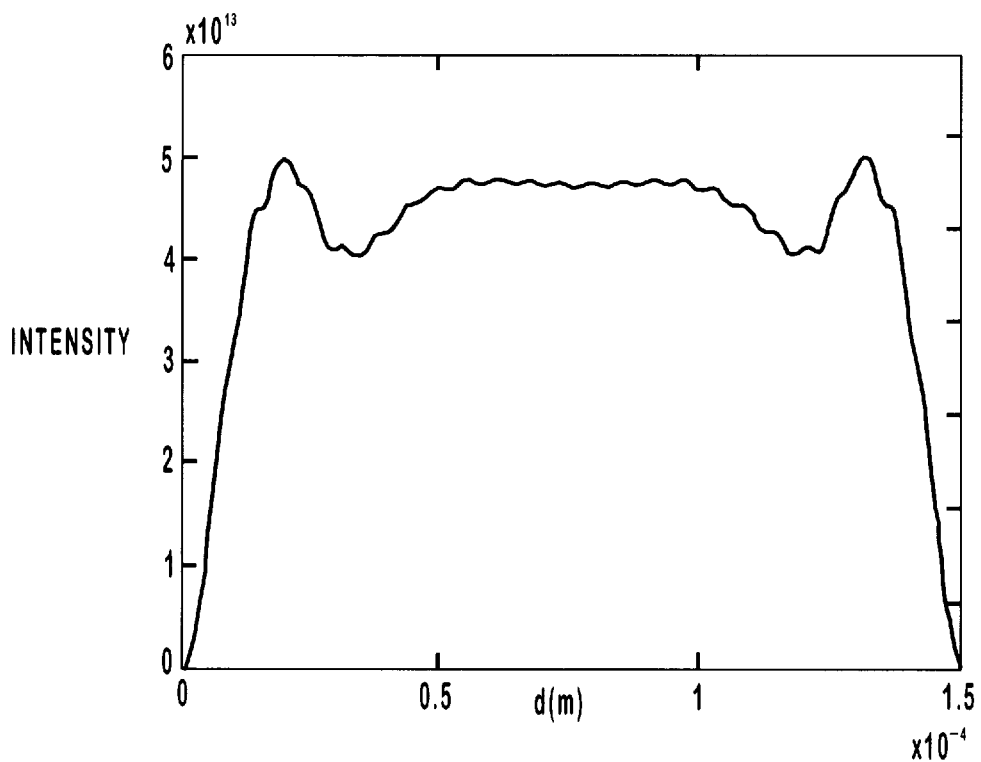
FIG. 6 is a graph illustrating the intensity profile of a semiconductor laser beam generated according to the present invention.

FIG. 5 shows a graph of the near-field intensity profile that was generated using the above numerical simulation for a broad-area semiconductor laser without an external cavity, such as shown in FIG. 1. FIG. 5 shows the filamentation problem in the form of high peaks and near-zero valleys, which preclude a well-focused, high intensity beam. FIG. 6 shows a graph of the near-field intensity profile that was generated using the above numerical simulation for a broad-area semiconductor laser with a Gaussian intensity profile promoting cavity, such as the parabolic reflector shown in FIG. 3, with the focal length (f) of the cavity at 15 mm. Both semiconductor lasers were considered as operating at the injection current level of I=20I$_{th}$. The above graphs show the intensity of the beam across the diameter (d) of the beam. These graphs demonstrate that the near-field pattern is improved and the filamentary behavior is substantially reduced by using the Gaussian profile cavity according to the present invention.

EXAMPLE 2

Figure 7:
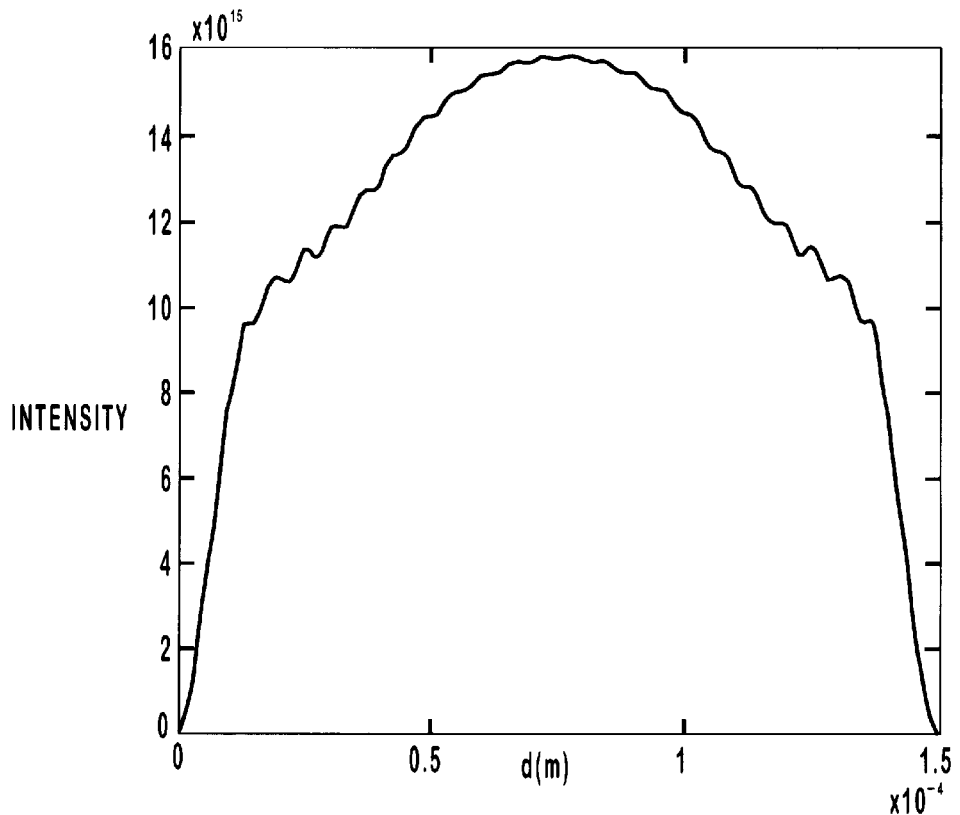
FIG. 7 is another graph illustrating the intensity profile of a semiconductor laser beam generated according to the present invention.
Figure 8:
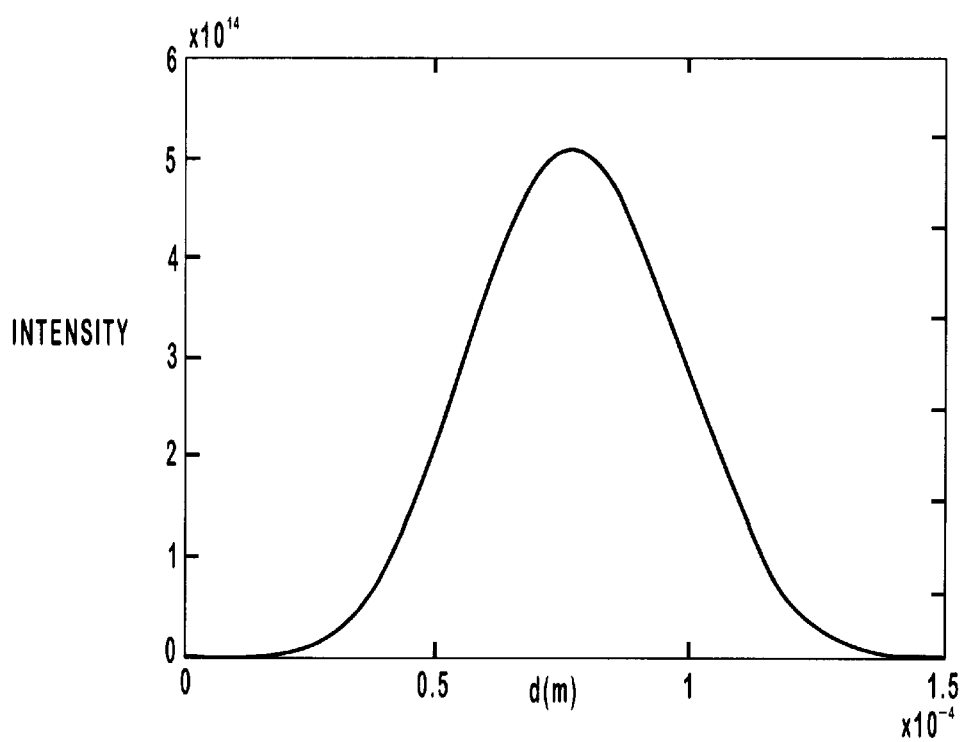
FIG. 8 is a further graph illustrating the intensity profile of a semiconductor laser beam generated according to the present invention.

The numerical simulation model described above in Example 1 was carried out for a broad-area semiconductor laser with a Gaussian intensity profile promoting cavity at two different focal lengths. FIG. 7 shows a graph of the near-field intensity profile that was generated for a Gaussian profile cavity with a focal length of the cavity at about 10 mm. FIG. 8 shows a graph of the near-field intensity profile that was generated for a Gaussian profile cavity with a focal length of the cavity at about 7 mm. As shown in FIGS. 7 and 8, the lateral mode profile of a broad-area semiconductor laser is improved by decreasing the focal length of the external cavity. When the focal length of the cavity was decreased to about 7 mm, the beam intensity profile pattern became a perfect Gaussian curve as shown in FIG. 8.

The above examples show that the lateral mode pattern of a continuous wave (cw) output semiconductor laser is improved and that filamentation can be eliminated by using a Gaussian profile promoting cavity such as a parabolic reflector according to the present invention. It should be noted that the beam-propagation model presented here can be applied to any type of cavity if the boundary conditions of the cavity can be accurately described.

EXAMPLE 3

Figure 9:
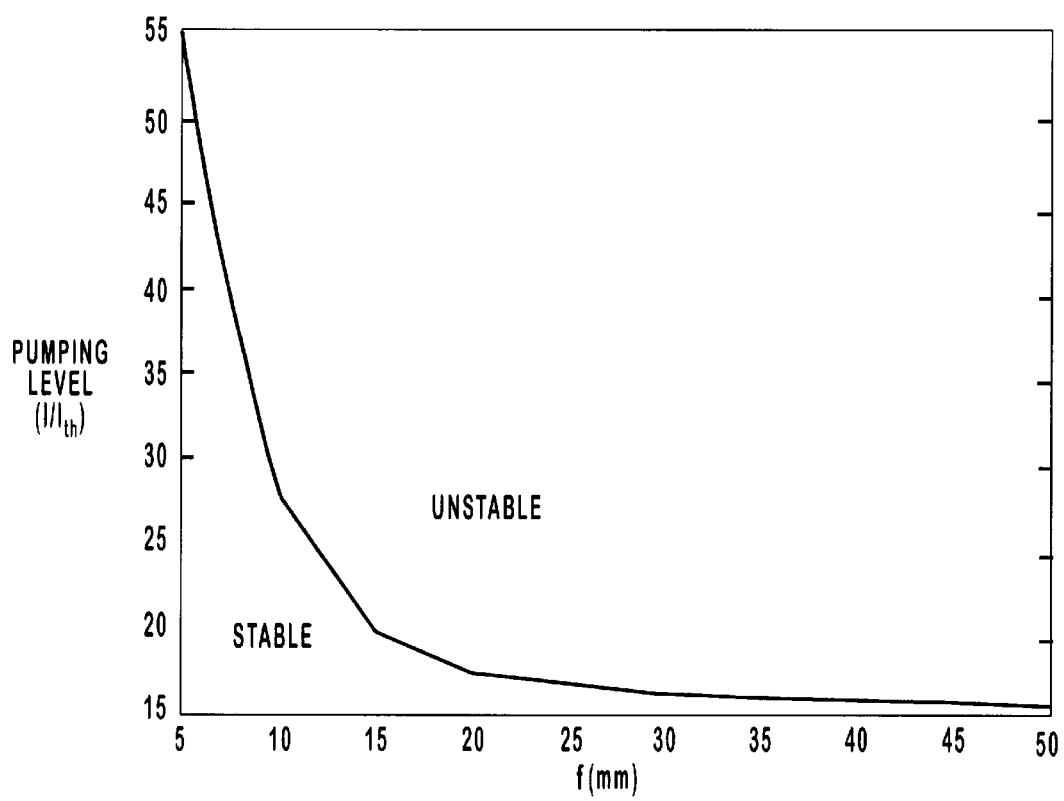
FIG. 9 is a graph illustrating the stability limit in the pumping current level vs. focal length plane for the present invention.

The numerical simulation model described above in Example 1 was used to determine the stability limits of a semiconductor laser with an external Gaussian intensity profile promoting cavity according to the present invention. FIG. 9 shows the stability limits in the pumping current level vs. focal length (I–f) plane for a semiconductor laser with fixed α=3.0 and stripe width w=100 μm. It can be seen from the graph of FIG. 9 that the injection current can be pumped to as high as about 50I$_{th}$ when the focal length of the cavity is approximately 5 mm.

Thus, the present invention maximizes the usable power density of broad-area semiconductor lasers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor laser system, comprising:
    a semiconductor laser having an active gain region with a beam emitting facet; and
    an external optical reflector having a Gaussian intensity profile promoting cavity facing the facet of the semiconductor laser, the cavity having a focal length a preselected distance from the cavity surface, the semiconductor laser positioned such that the facet is at the focal length distance from the cavity surface;
    wherein a laser beam with a substantially Gaussian intensity is produced by the semiconductor laser system.

2. The system of claim 1, wherein the semiconductor laser is a diode laser.

3. The system of claim 2, wherein the diode laser is formed of a gallium aluminum arsenic compound.

4. The system of claim 2, wherein the diode laser has an anti-reflection coating on one end and a high reflection coating on the other end.

5. The system of claim 1, wherein the cavity has a substantially parabolic shape.

6. The system of claim 1, wherein the focal length is less than about 20 mm.

7. The system of claim 1, wherein the focal length is about 15 mm.

8. The system of claim 1, wherein the focal length is about 10 mm.

9. The system of claim 1, wherein the focal length is about 7 mm.

10. The system of claim 1, wherein the external optical reflector is made of a light transmissive material such that up to about 50% of the laser light generated is transmitted therethrough.

11. The system of claim 10, wherein up to about 30% of the laser light generated is transmitted through the optical reflector.

12. The system of claim 1, wherein the external optical reflector comprises a highly reflective material.

13. The system of claim 12, further comprising a beam splitter positioned between the semiconductor laser and the external optical reflector.

14. A semiconductor laser system, comprising:
    a broad-area semiconductor laser having an active gain region with a beam emitting facet; and
    an external optical reflector having a cavity with a substantially parabolic shape facing the facet of the semiconductor laser, the cavity having a focal length a preselected distance from the cavity surface, the semiconductor laser positioned such that the facet is at the focal length distance from the cavity surface;
    wherein a laser beam produced by the semiconductor laser system has an intensity profile with a Gaussian, near-Gaussian, or super-Gaussian shape.

15. The system of claim 14, wherein the focal length is less than about 20 mm.

16. The system of claim 14, wherein the focal length is about 15 mm.

17. The system of claim 14, wherein the focal length is about 10 mm.

18. The system of claim 14, wherein the focal length is about 7 mm.

19. The system of claim 14, wherein the external optical reflector is made of a light transmissive material such that up to about 50% of the laser light generated is transmitted therethrough.

20. The system of claim 19, wherein up to about 30% of the laser light generated is transmitted through the optical reflector.

21. A semiconductor laser system, comprising:

a broad-area semiconductor laser having an active gain region with a beam emitting facet;

an external optical reflector having a cavity with a substantially parabolic shape facing the facet of the semiconductor laser, the cavity having a focal length a preselected distance from the cavity surface, the semiconductor laser positioned such that the facet is at the focal length distance from the cavity surface; and a beam splitter positioned between the semiconductor laser and the external optical reflector;

wherein a laser beam produced by the semiconductor laser system has an intensity profile with a Gaussian, near-Gaussian, or super-Gaussian shape.

22. The system of claim 21, wherein the focal length is less than about 20 mm.

23. The system of claim 21, wherein the focal length is about 15 mm.

24. The system of claim 21, wherein the focal length is about 10 mm.

25. The system of claim 21, wherein the focal length is about 7 mm.

26. The system of claim 21, wherein the external optical reflector is made of a highly reflective material.

27. The system of claim 21, wherein the beam splitter is configured to deflect a portion of laser light at an angle of about 90° with respect to the direction of light propagation.

28. A method of generating a laser beam from a semiconductor laser in order to eliminate or substantially reduce filamentation of the laser beam, the method comprising the steps of:

providing a semiconductor laser having an active gain region with a beam emitting facet;

positioning an external optical reflector having a Gaussian intensity profile promoting cavity, with a focal length a preselected distance from a surface of the cavity, such that the facet of the semiconductor laser is at the focal length distance from the cavity surface; and directing a laser beam from the semiconductor laser at the cavity of the optical reflector such that the beam has a substantially Gaussian intensity.

29. The method of claim 28, wherein the cavity has a substantially parabolic shape.

30. The method of claim 28, wherein the focal length is less than about 20 mm.

31. The method of claim 28, wherein the focal length is about 15 mm.

32. The method of claim 28, wherein the focal length is about 10 mm.

33. The method of claim 28, wherein the focal length is about 7 mm.

34. The method of claim 28, wherein the external optical reflector is made of a light transmissive material such that up to about 50% of the laser beam generated is transmitted therethrough.

35. The method of claim 34, wherein up to about 30% of the laser beam generated is transmitted through the optical reflector.

36. The method of claim 28, further comprising the step of placing a beam splitter between the semiconductor laser and the external optical reflector.

37. The method of claim 36, wherein the beam splitter is configured such that a portion of laser light reflected from the cavity is deflected by the beam splitter at an angle of about 90° with respect to the direction of beam propagation.

38. A semiconductor laser system, comprising:

a broad-area semiconductor laser having an active gain region with a beam emitting facet; and an external digital optics member positioned adjacent to the semiconductor laser and having a Gaussian intensity profile promoting surface contiguous with the facet of the semiconductor laser;

wherein a laser beam produced by the semiconductor laser system has an intensity profile with a Gaussian, near-Gaussian, or super-Gaussian shape.

39. The system of claim 38, wherein the external digital optics member is made of a light transmissive material such that up to about 50% of the laser beam generated is transmitted therethrough.

40. The system of claim 38, wherein the Gaussian intensity profile promoting surface is etched to form a plurality of steps.

41. A method of generating a laser beam from a semiconductor laser in order to eliminate or substantially reduce filamentation of the laser beam, the method comprising the steps of:

providing a semiconductor laser having an active gain region with a beam emitting facet;

providing an external digital optics member having a Gaussian intensity profile promoting surface that has been etched to form a plurality of steps therein;

positioning the external digital optics member adjacent to the semiconductor laser such that the etched surface of the digital optics member is contiguous with the facet of the semiconductor laser; and directing a laser beam from the semiconductor laser at the external digital optics member such that the beam has an intensity profile with a Gaussian, near-Gaussian, or super-Gaussian shape.

* * * * *